United States Patent [19]

Young

[11] 4,352,446

[45] * Oct. 5, 1982

[54] SUBSTRATE SEPARATING MACHINE AND METHOD

[75] Inventor: David H. Young, Warrington, Pa.

[73] Assignee: MTI Systems Corporation, Ivyland, Pa.

[*] Notice: The portion of the term of this patent subsequent to Nov. 25, 1997, has been disclaimed.

[21] Appl. No.: 163,171

[22] Filed: Jun. 26, 1980

Related U.S. Application Data

[62] Division of Ser. No. 941,181, Sep. 11, 1978, Pat. No. 4,235,357.

[51] Int. Cl.³ .............................................. B26F 3/00
[52] U.S. Cl. .......................................... 225/1; 225/2; 225/96.5; 225/97; 225/103
[58] Field of Search ................. 225/1.2, 96.5, 97, 98, 225/103

[56] References Cited

U.S. PATENT DOCUMENTS

| | | | |
|---|---|---|---|
| 3,124,988 | 3/1964 | Albert | 83/94 |
| 3,279,664 | 10/1966 | Lynch | 225/96.5 |
| 3,286,893 | 11/1966 | Zellers, Jr. | 225/2 |
| 3,507,430 | 4/1970 | Skinner et al. | 225/103 |
| 3,562,803 | 2/1971 | Townsend | 225/104 |
| 3,615,047 | 10/1971 | Feldman et al. | 225/1 |
| 3,687,345 | 8/1972 | Carlson et al. | 225/1 |
| 3,790,051 | 2/1974 | Moore | 225/96.5 X |
| 3,865,288 | 2/1975 | Hunsinger et al. | 225/96.5 |
| 3,920,168 | 11/1975 | Regan et al. | 225/96.5 X |
| 4,068,788 | 1/1978 | Gubitose et al. | 225/2 X |

Primary Examiner—Frank T. Yost
Attorney, Agent, or Firm—Weiser, Stapler & Spivak

[57] ABSTRACT

A machine and method for subdividing into individual substrates a wafer which is prescored with a pattern of intersecting score lines defining the substrates. The wafer is progressively directed over a first wafer-engaging surface substantially paralleling one set of score lines, and this surface operates during a breaking operation to impart a localized force at a score line in the set. The wafer is halted for the breaking operation, after which the broken-off portion is directed over a second wafer-engaging surface substantially paralleling the other set of score lines. This second surface operates, during a substrate breaking operation, to apply a localized force adjacent a score line of the other set. The broken-off portion is also halted for this second breaking operation, in which an individual substrate is separated from the previously broken-off portion of the wafer. An inclined track transports the material from the first to the second breaking operation. A magazine may be provided at the end of the track into which the separated substrates are inserted in a uniformly oriented manner; preferably through a hole in the bottom of the track.

9 Claims, 8 Drawing Figures

SUBSTRATE SEPARATING MACHINE AND METHOD

This is a division of application Ser. No. 941,181, filed Sept. 11, 1978, now U.S. Pat. No. 4,235,357, issued Nov. 25, 1980.

This invention relates to the manufacture of small, generally rectangular, plate-like elements which are utilized in a variety of applications, particularly in electronics.

Elements of this general configuration are encountered as the so-called semiconductor "chips", which constitute the main body of integrated circuits. Elements of the same general configuration are also encountered as ceramic substrates, upon which are deposited other substances to provide certain electronic functions. For example, such ceramic substrates are used as the support for films of resistive material which provide resistive networks for inclusion in electronic circuitry. They are also used as the supports for layered structures of conductive and insulative materials which provide capacitors for inclusion in electronic circuitry.

In all of these applications, such plate-like elements must typically be produced in large quantities (frequently running into the hundreds of thousands, or even millions). Yet it is desirable to do so in a comparatively simple and inexpensive manner, and also in a manner which will leave these elements best suited for whatever subsequent processing steps are to be performed with them.

With these desired characteristics in mind, it has been conventional to initially manufacture, not individual ones of these small elements, but rather much larger plates of the particular material involved (e.g. ceramic), and of the thickness of the individual elements which constitute the desired end product. Such a large plate is frequently referred to as a wafer, while the individual elements derived therefrom are referred to as substrates. This is the terminology which will be used herein.

It has also been conventional to define on these wafers—while still "in one piece"—the intended boundary lines between the individual substrates which are to be derived from each wafer by means of grooves scored, or scribed into the surface of the wafer. Scoring is frequently accomplished by means of laser beams, due to the great speed and high precision with which they can accomplish this, but other methods can be and have been used.

In any event, the result is that the wafer surface has a criss-crossing rectangular grid of score lines, each rectangle enclosing and defining a single substrate.

The next step then was to break this wafer, along the score lines, thereby separating the individual substrates from each other.

Simple as this may sound at first blush, the fact is that a great deal of effort has been devoted to the implementation of this wafer-breaking step, and yet much room for further improvement has remained.

To illustrate, U.S. Pat. No. 3,615,047 discloses one known technique for accomplishing this breaking of wafers into individual substrates. This involves clamping the wafer between flexible membranes. These membranes, with the wafer between them, are forced to assume a small radius of curvature, first in a direction to cause bending across one set of parallel score lines, and later again to cause bending across the other, orthogonal set of score lines. This is intended to crack or break the wafer into its individual substrates.

It turns out that this simple-sounding technique has many shortcomings. First, it is obviously a tedious process to insert wafer after wafer between the membranes, draw the vacuum which is needed to clamp the wafer, and then carry out the remaining steps, including also release of the vacuum, cleaning out of the debris from between the membranes, and so forth.

Secondly, this technique of U.S. Pat. No. 3,615,047, is beset by the problem that there is really no assurance that the breaking will take place along the score lines. The areas of the wafer between score lines are bent just as much as the areas immediately adjacent the score lines themselves. Undoubtedly, there will be a greater tendency to break along the score lines, and actual practice confirms this. However, a not insignificant fraction of the breaks will occur elsewhere, leading to defective substrates.

Incidentally, this is a grave problem for all prior techniques, because the wafers are not only thin, and fragile for that reason, but the materials of which these wafers are made are frequently brittle (e.g. ceramic) and crack readily even where they have not been intentionally scored.

In addition to the foregoing problems, however, there is one which perhaps overshadows all the others, however serious they may be in themselves. That further problem is what to do with the individual substrates after they have been formed from the wafer by breaking of the latter as described. After all, what this yields is simply a batch of tiny, loose substrates, either still lying arranged more less side-by-side on one of the membranes used in the breaking, or in a heap where they have been slid down from the membrane, in order to free it for the next wafer to be processed.

In either case, what follows is typically some kind of hand operation for gathering together all these individual substrates and stacking them in some type of neat, regular pile for moving to the next operation. The situation is further complicated by the fact that rejects arising from imperfect breaking remain part of the group, unless manually separated out. Moreover, the electrical component coatings, such as resistive or capacitive coatings, have frequently been applied to all of the substrates while still together in wafer form, i.e. before breaking. After breaking, it therefore usually becomes necessary not only to stack the individual substrates, but also to orient them in the stack so that these electrical coatings are presented in a uniform orientation for further processing (soldering on of leads, mounting of discrete components, insertion in circuit boards, etc.).

Various other techniques for breaking wafers into individual substrates have been proposed and/or used. Indeed, some of these others are also summarized in the above-mentioned U.S. Pat. No. 3,615,047, and two additional patents dealing with some of these are referenced therein, namely U.S. Pat. Nos. 3,167,228 and 3,182,873.

It would be unnecessarily tedious to discuss the relative demerits of these and still other known techniques. Suffice it to say that they all suffered from one or more serious shortcomings, generally along the lines previously discussed.

The upshot of all this is that there was a serious bottleneck in the manufacture of electronic equipment due to these shortcomings of the wafer breaking operation.

Accordingly, it is an object of the present invention to provide an improved technique for breaking prescored wafers into individual substrates.

It is another object to provide such a technique which minimizes the hand operations involved.

It is another object to provide such a technique which can be practiced at a high rate of production.

It is another object to provide such a technique which delivers the individual wafers in stacked and oriented form.

It is another object to provide such a technique which accommodates varying dimensions of wafers and substrates.

It is another object to provide such a technique which enables the separation of reject substrates.

It is another object to provide a machine for practicing the inventive technique.

These and other objects are achieved in accordance with the present invention by a machine having the following characteristics. A flat bed is provided on which a prescored wafer is placed for the purpose of having this wafer subdivided into individual substrates along the score lines. A pushing mechanism is provided for advancing the wafer past a ledge which parallels one set of score lines. The advance is halted when the wafer protrudes, cantilevered, beyond the ledge by the distance between consecutive score lines. The wafer is then clamped down against the bed, just behind the score line positioned at the ledge, and a breaking bar is lowered, to depress the cantilevered portion of the wafer until it snaps off at that score line.

The snapped-off portion is allowed to drop into a recess at the foot of the ledge and is transported away in a direction parallel to the score line at which it was snapped off, i.e. transverse to the advance previously described.

A second ledge is provided along the transporting-away path of the snapped-off portion, aligned with the score lines which extend at right angles to the first-mentioned lines. When the snapped-off portion protrudes, cantilevered, beyond that second ledge by the distance between these score lines, the transporting away is stopped.

The stopped wafer portion is again clamped, just behind the second ledge, and the cantilevered portion is depressed until it snaps at the score line aligned with the second ledge.

Thus, after passage of the second ledge, there are present only individual substrates which have been separated from the wafer in both orthogonal directions along the score lines.

Each separated individual substrate is allowed to drop into a recess at the foot of the second ledge, and is then further transported away from that ledge to make room for the next substrate.

A magazine-like receptacle for the individual substrates is provided at the end of the transporting-away path. The substrates are delivered consecutively to the mouth of that magazine and are inserted into it in uniformly oriented manner, preferably by gravity aided by a mechanical plunger mechanism. An ingenious follower inside the magazine provides a support on which the substrates come to rest flat, and uniformly stacked, without binding at the walls of the magazine.

An inspection for reject substrates can be performed on this machine before the substrates are inserted into the magazine, and rejects eliminated before they reach that magazine.

Preferably the wafer bed, the breaking ledges and the transporting-away paths are all positioned on an incline, so that gravity aids in initially aligning the wafer on the bed, and thereafter performs the entire task of transporting away the snapped-off portions and separated substrates.

For further details reference is made to the discussion which follows in light of the accompanying drawings wherein FIG. 1 is an overall perspective view of a machine underlying the present invention.

Figure 1:
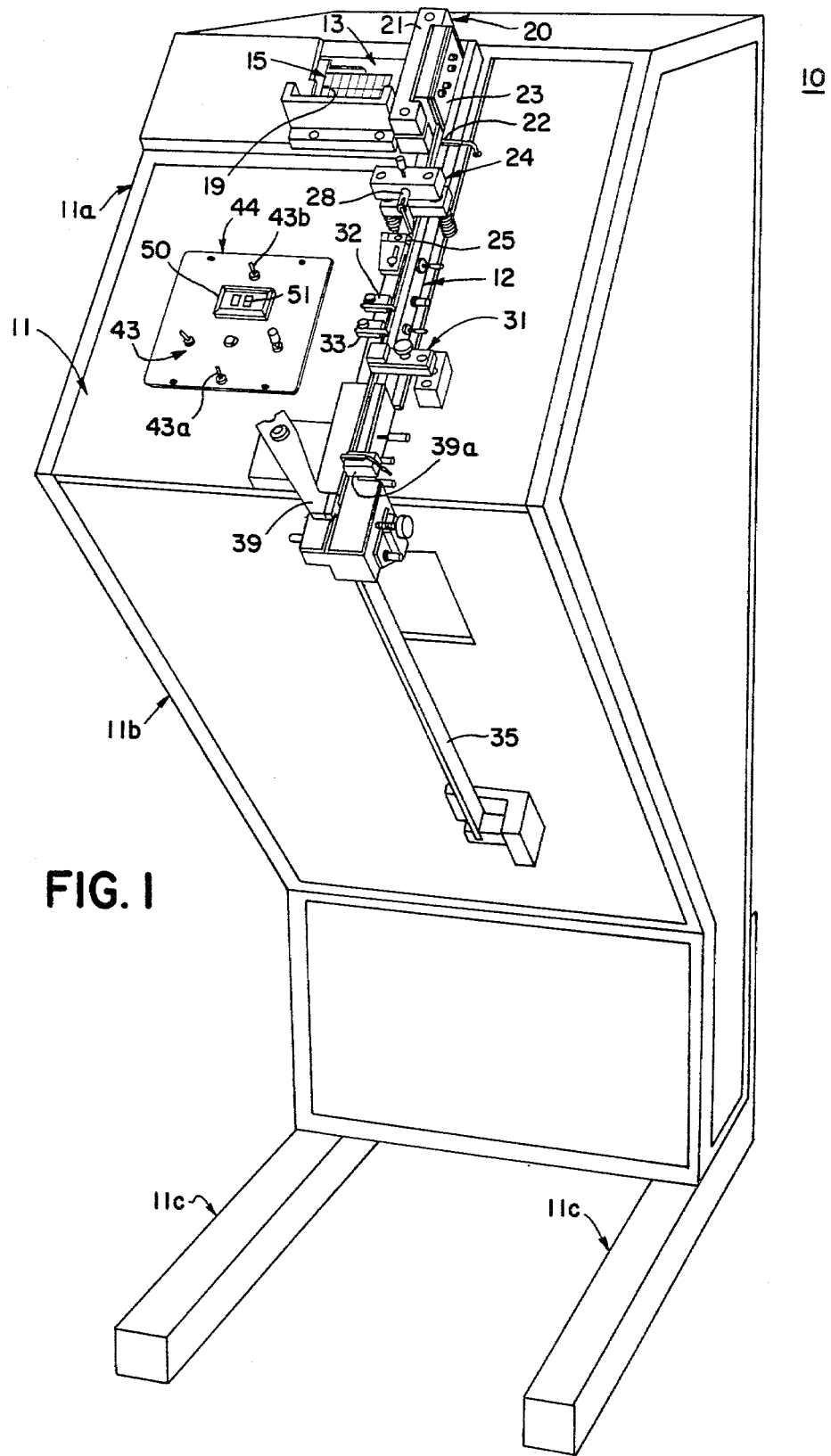

Referring now to these drawings, and particularly first to the overall view of FIG. 1, a machine 10 embodying the present invention includes a cabinet 11 which supports the various components of the machine. The top portion 11a of this cabinet is inclined downward and forward. The bottom portion 11b is inclined downward and rearward. This permits the operator of the machine to approach it conveniently, and even to sit in front of the machine, with all the elements of normal concern to the operator within easy view and reach. To counteract the forward tilting tendency of this cabinet construction, forwardly extending horizontal support members 11c are provided for the machine.

Mounted on the front of the top cabinet portion 11a is a downwardly extending track 12. Details of this track 12 are provided later, but basically it serves to guide and deliver at its lower, forward end substrates introduced into the track at its upper end.

The introduction of these substrates is accomplished by the feed-in apparatus 13 shown to the left of the upper end of track 12. This apparatus 13 is more clearly visible in FIG. 2 (see also FIG. 2a). It consists of a bed plate, upon which there is placed the original wafer 15 to be subdivided by machine 10. One such wafer 15 is shown in place on bed plate 14. As can be seen, it has previously been scored at lines 16 and 17 extending mutually perpendicularly across the face of wafer 15. These score lines thus define the desired individual substrates 18. The lower edge of wafer 15 rests against a horizontal ledge (not visible in FIG. 1), whereby it is aligned for further processing in machine 10. A tongue 19 is horizontally reciprocable toward and away from wafer 15 in order to intermittently propel this wafer from left to right in FIG. 2.

This left-to-right movement causes the wafer 15 to slide toward first separator station 20. This station includes a hold-down member 21 which is supported above bed plate 14 near the edge of track 12.

Figure 2:
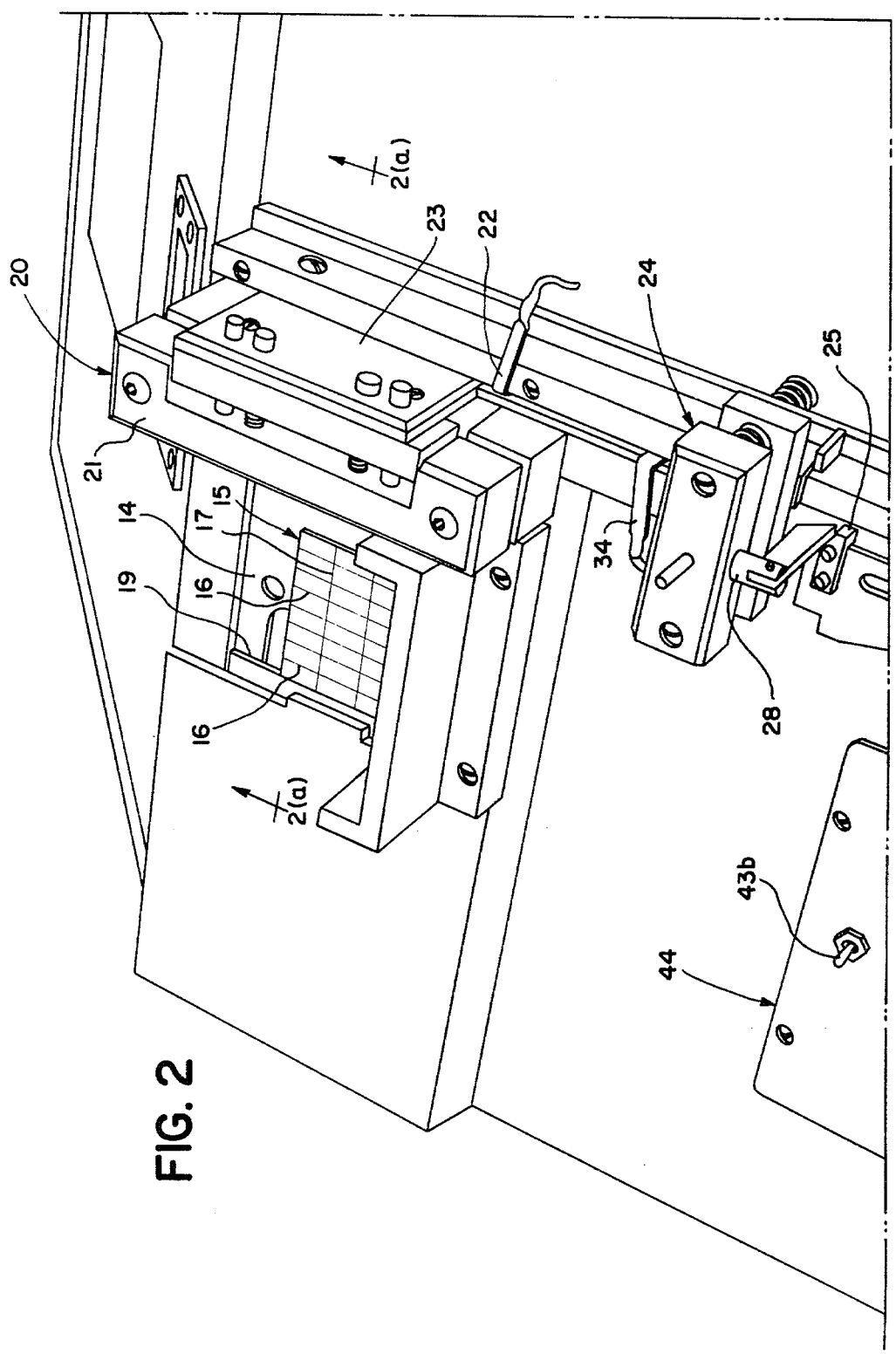
FIG. 2 is a view, to a somewhat larger scale, of an upper portion of the machine of FIG. 1.
Figure 2A:
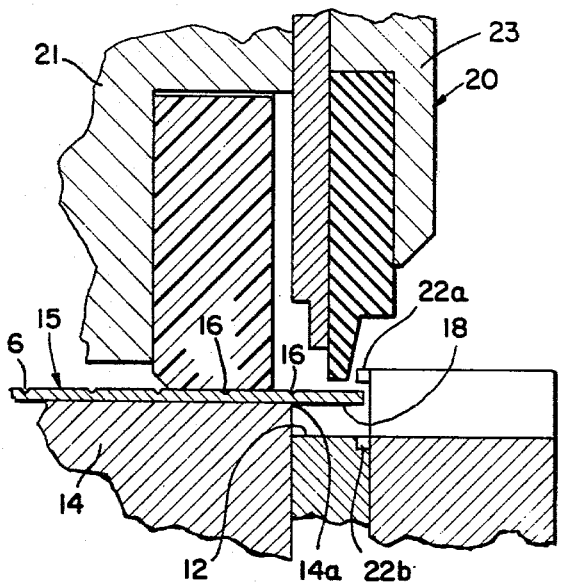
FIG. 2(a) is a partial section taken through 2(a)—2(a) in FIG. 2, schematically showing the principal operating elements of the said upper machine portion.

As best seen in the diagrammatic representation of FIG. 2(a), this hold-down member 21 is vertically reciprocable to alternately define a gap between its lower edge and wafer 15, and to close that gap and rest firmly on the top of the wafer. As also best seen in FIG. 2(a), a photoelectric sensing arrangement 22 is positioned with respect to track 12 so that a beam of light from light source 22a reaches photocell 22b when there is no interposed wafer 15, but is interrupted when the wafer, propelled by tongue 19, reaches the location of this beam. Such interruption causes the tongue 19 to stop propelling the wafer toward the track 12. This therefore determines the extent to which wafer 15 overhangs the track 12.

The photoelectric sensing arrangement 22 is adjustable in position so as to cause a corresponding variation in the extent of wafer overhang over track 12 in response to the push from tongue 19.

The adjustment is made so that the wafer 15 will stop when it extends over track 12 by the desired width of a single substrate 18. The score line 16 to the left of that substrate will therefore be aligned with the right-hand ledge 14a of bed plate 14. The same will be true for all substrates 18 forming a single vertical column in wafer 15.

This stopping of wafer 15 is accompanied by a lowering of member 21 so as to bear on the top of wafer 15 to the left of ledge 14a. The wafer 15 is thereby clamped in that position.

This clamping is followed by the descent of first breaking member 23. This member is lowered to such an extent that it deflects downwardly the portion of wafer 15 extending over track 12 enough so that this portion snaps off along its adjacent score line 16, and drops onto track 12. In this way there is separated from wafer 15, one column of substrates 18 forming part of the wafer.

This column immediately begins to slide downwardly along track 12. At the same time, hold-down member 21 and breaking member 23 retract upwardly in preparation for a repetition of the cycle described above.

Figure 3A:
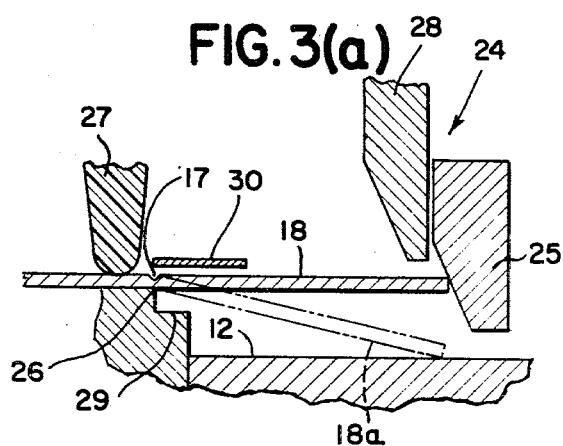
FIG. 3(a) is a partial section taken through 3(a)—3(a) in FIG. 3, showing schematically the principal operating elements of the said lower machine portion.
Figure 3:
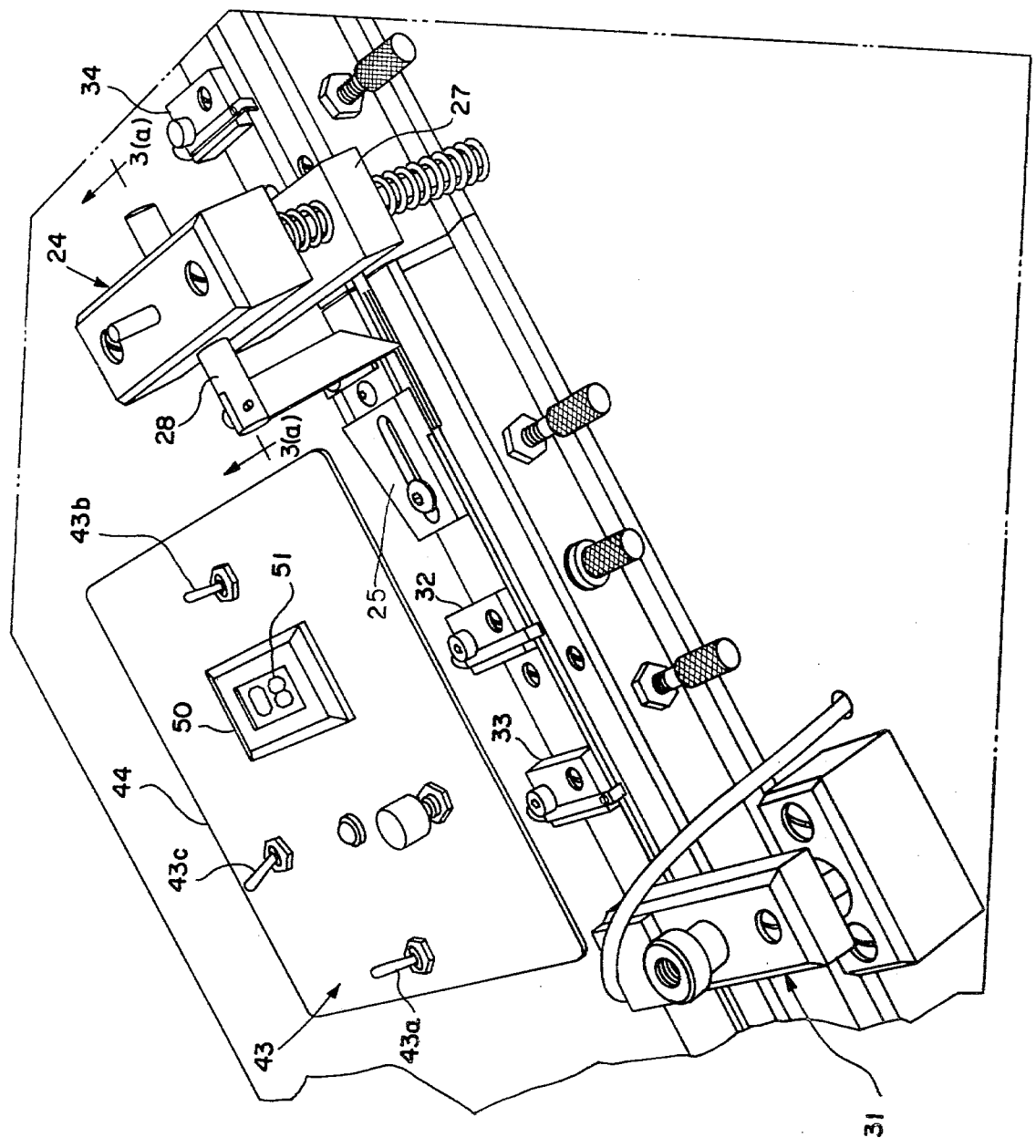
FIG. 3 is a view of a lower portion of the machine of FIG. 1.

The separated column of substrates 18 proceeds down track 12 until it reaches the second separating station 24 (see FIGS. 2 and 3). This is the means for additionally separating each column of substrates 18 into the individual substrates ultimately desired.

To that end, and as best seen from the schematic illustration of FIG. 3(a) (but see also FIGS. 2 and 3), the column of substrates 18 descending track 12 is arrested by stop member 25. This stop member 25 is adjustable along track 12 and is so positioned that the score line defining the upper end of the lowest substrate 18 in the column comes to rest aligned with ledge 26 in track 12. A hold-down member 27 then descends behind that score line, and clamps the higher-positioned substrates 18 of the column against track 12 above ledge 26.

A second breaking member 28 is positioned so as to be reciprocable between the position shown in FIG. 3(a) and a lowered position, in which it deflects substrate 18 enough downwardly to cause it to snap along score line 17.

The broken-off substrate 18 (shown in phantom at 18a) drops down onto the lower portion of track 12, and slides downwardly beneath stop member 26.

A raised stop 29 is preferably provided immediately downstream from ledge 26. This step 29 holds up the trailing edge of the newly separated substrate 18 as it begins to slide down the track 12, and prevents it from being overrun by the next following substrate. Such overrunning could cause a jam-up of two superposed substrates in the gap between stop member 25 and track 12. A cover 30 is preferably also provided to prevent an upward bounce of the separated substrate, as it is deflected and broken away by breaking member 28.

As this breaking occurs, the hold-down member 27 lifts up to permit the next substrate 18 to take its position against stop member 25, and the breaking member 28 also retracts, all in readiness for a repetition of the cycle.

As indicated in FIG. 3 (see also FIG. 1), the separated substrates 18 now proceed further down track 12, past a section in which they can be subjected to further operations.

In particular, there may be positioned here an inspection station 31, for determining whether the substrates 18 have their desired characteristics, or are to be considered as rejects.

For example, electrical continuity checks can be made at this station, by automatically lowering electrodes to the surface of a substrate stopped there. This would be accomplished by contact and sensing means which are well known in this art.

To stop each substrate at the inspection station 31, there may be provided, recessed in track 12, a solenoid-operated pin (not shown) which extends upwardly above the track enough to arrest the downward slide of a substrate. When the inspection operation is complete, the solenoid permits the pin to retract, releasing the substrate. The pin then re-extends, and the cycle recommences.

A pin-and-solenoid arrangement such as used at 31 may be obtained, for example, from Ledex, Inc., Dayton, Ohio, under Catalog No. 178763-038. Application of power causes the pin to extend upwardly, when the solenoid is mounted with the pin up. Removal of power allows the pin to drop. Preferably a restoring spring and/or weighted collar is added to reinforce the downward pin movement when power is removed.

Upstream from such an inspection station 31, there are preferably provided one or more additional stop means 32, 33 for the substrates sliding toward the inspection station 31. These are provided to insure that only one substrate at a time reaches the inspection station. To that end, stop means 32, 33 operate somewhat like an escapement, stop means 32 releasing a substrate 18 only after the one held back by stop means 33 has been released.

The stop means 32 and 33 may utilize the same type of solenoid-retractable stopping pins as inspection station 31, and photoelectric sensing means for sensing the presence and absence of substrates 18 at the relevant points.

A further photoelectric sensing means 34 may be positioned upstream from second separating station 24. Its purpose is to prevent the first separating station from cycling until the column of substrates 18 separated by the prior cycle has descended far enough down track 12 to free that track for receipt of a new column. As in all the other photoelectric sensing means used in machine 10, this can be done simply by a conventional lamp-and-photocell combination, so positioned that the light beam is interrupted by the presence of a substrate. The electrical indication so provided is utilized for control in conventional manner.

At the end of their descent along track 12, the individual substrates 18 are thus available in completely separated form. Moreover, these substrates arrive at the end of the track in a reliable orientation, corresponding to that which they have in the original wafer 15, as introduced into the machine 10.

After leaving track 12, these separated substrates may be utilized in any desired manner. However, typically it is desired to collect and store newly separated substrates for further use.

Figure 4A:
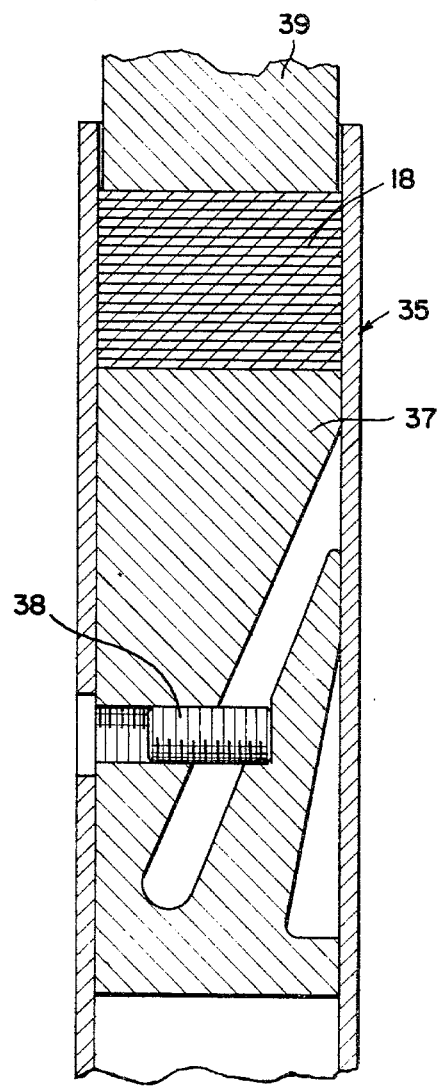
FIG. 4(a) is a partial section taken through 4(a)—4(a) in FIG. 4, showing schematically the principal operating elements of the said still lower machine portion.
Figure 4:
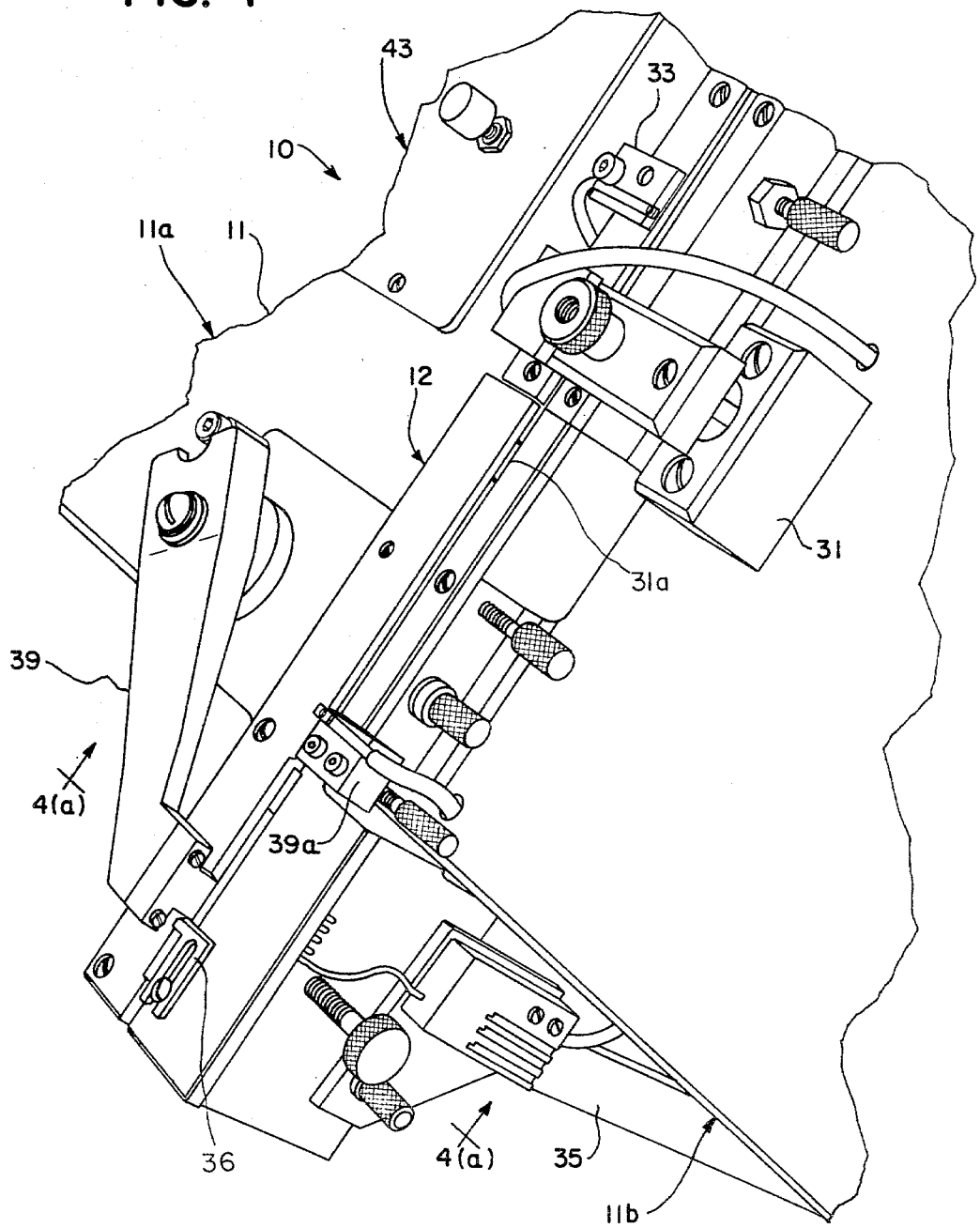
FIG. 4 is a view of a still lower portion of the machine of FIG. 1.

In accordance with the present invention, this may be done preferably by attaching at the lower end of track 12, a storage magazine 35 (see FIGS. 1 and 4).

As can be seen, especially in FIG. 4(a), the magazine may consist of a C-shaped channel with internal dimensions conforming substantially to the width and length dimensions of substrates 18.

One end of this channel 35 is mounted adjacent a correspondingly dimensioned aperture (not visible in the drawings) provided in the bottom of track 12. A stop member 36 is also provided to arrest the forward movement of each substrate 18 as it slides into position over the aperture. This substrate therefore drops through the aperture and into the magazine 35. There it comes to rest upon a follower 37, which is positioned within the channel forming the magazine 35. This follower 37 is of generally U-shaped configuration, as shown in FIG. 4(a). The purpose of this is to enable the pressure between the follower and the inside wall of the magazine channel to be adjusted, by means of screw 38 which passes through a threaded hole in one arm of the U and bears against the other arm. This pressure provides a uniform degree of friction—and therefore resistance to movement on the part of the follower. Thus, the follower action is independent of the number, and therefore also of the weight of the substrates 18 which may gradually accumulate upon this follower. Preferably this adjustment of follower 37 is such that the weight of the substrates 18 themselves is not sufficient to cause the follower to slide downwardly inside the magazine 35.

Initially the follower 37 is positioned a little below the upper end of magazine 35, i.e. below that end which engages the track 12. This positioning is such that two or three substrates 18 can drop into the magazine and land on the follower before the magazine becomes filled to the top. After this, a plunger 39 is caused to move in a direction toward the magazine 35. This plunger 39 has a protrusion generally of the shape of a substrate 18, but small enough to fit through the aperture in track 12 and into the magazine 35. The movement of this plunger 39 is such that the substrates 18 previously accumulated in the magazine are pushed deeper into it by an amount equal to the thickness of, say, two such substrates. The plunger 39 then retracts upwardly and additional substrates 18 can drop into the magazine 35 as they arrive. To prevent substrates 18 sliding down track 12 from wedging up against plunger 39, while the latter extends into magazine 35, a solenoid retractable stopping pin arrangement 39a is positioned upstream from the plunger. It is so coordinated as to release substrates only when the plunger is retracted out from the magazine.

Upstream from the magazine connection aperture, there may be provided what amounts to a trap door in the bottom of track 12. This door is not visible in the drawings. Its purpose is to segregate reject substrates from inspection station 31 before they can reach the magazine 35. To that end, the reject trap door is opened after each release of a reject from the inspection station.

The various operations of moving arm 39, trap door opening, etc. are preferably carried out by solenoid actuations in a manner which, in itself, is known and therefore need not be further described in detail.

Figure 5:
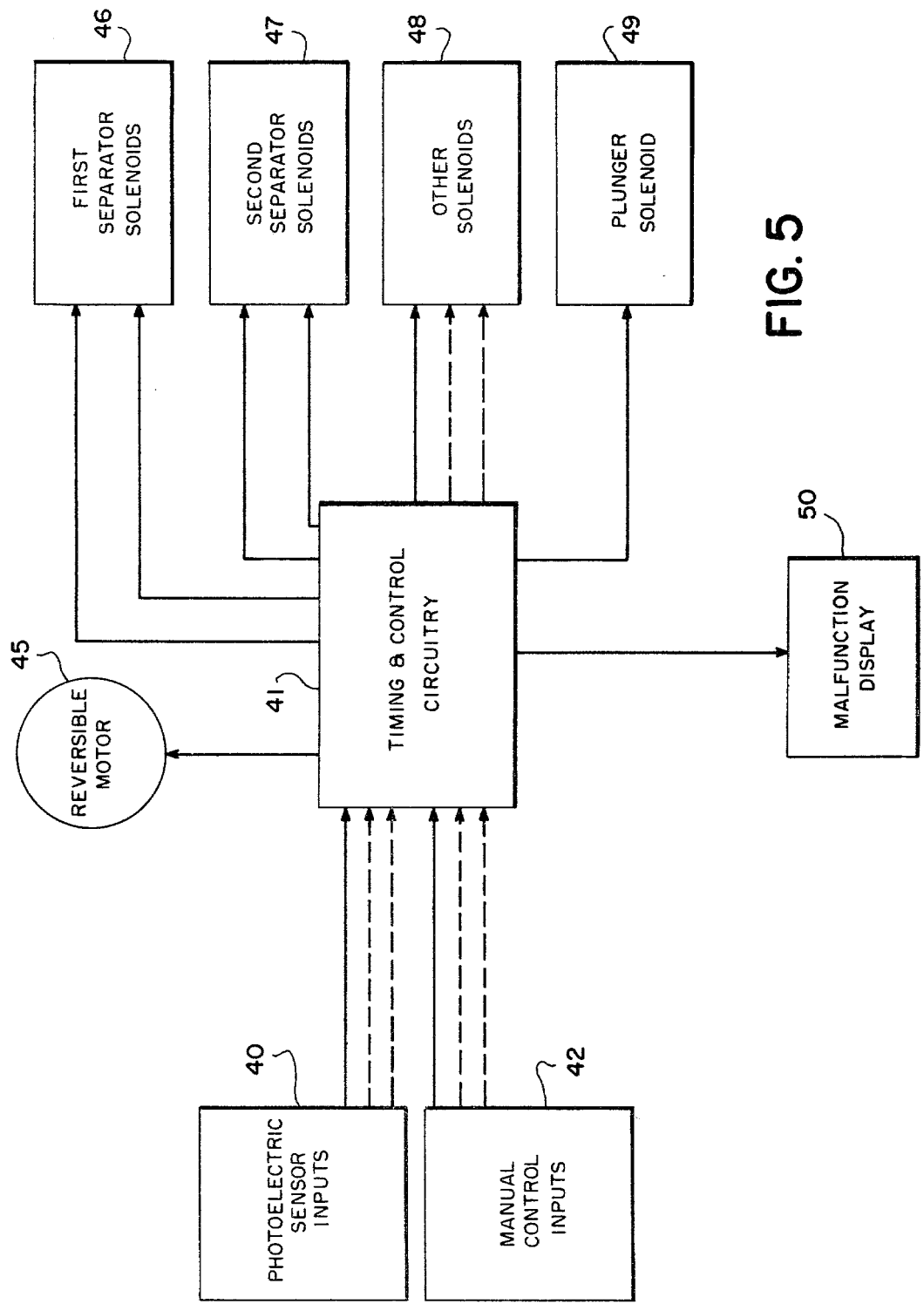
FIG. 5 is a block diagram of the electronic portions of the machine of FIG. 1.

The electronic circuitry which may be utilized in illustrated in block diagram form in FIG. 5, to which reference may now be had. As shown there, the signals derived from the various photoelectric sensing means previously described are utilized as the control inputs 40 to timing and control circuitry 41. In addition, manual control inputs 42 to circuitry 41 are also provided. These may be derived from switches 43 mounted on a control panel 44 (see FIGS. 1 and 3).

These switches 43 may include a switch 43a for applying electric power to the whole machine 10, and a switch 43b for starting the normal operation of a reversible motor 45 which produces movement of tongue 19, as previously described, and thereby also movement of wafer 15 into the first separator station 13. Switch 43b may also be adjustable to cause the motor 45 to move tongue 19 to its left-most position, thereby opening wide the access to bed plate 14, for insertion of a wafer 15, or removal if desired. A switch 43c may be provided which, in one position, causes the machine to cycle continuously and, in the other position, to cycle only once and then stop until reactivated.

Circuitry 41 processes all of the foregoing inputs to provide the appropriate control signals to the various solenoids in the machine. These include the solenoid 46 operating the hold-down and breaking members of the first separator station, the corresponding soleniods 47 of the second separator station, the various stop-pin solenoids 48, and plunger solenoid 49.

The broken lines in FIG. 5 indicate that there is a plurality of connections, whose exact number is determined by the number of functions to be performed, which may be different in different embodiments.

In addition, the circuitry 41 may operate a malfunction display 50. This may include a digital read-out 51 also positioned on control panel 44, which displays a number that indicates to the operator what the specific malfunction is. This is accomplished as follows. It is apparent that the overall operation of machine 10 is a sequential one, i.e. the different operations involved occur one after the other. The timing and control circuitry is programmed accordingly. If a malfunction occurs, that circuitry can therefore readily determine at what stage in the sequential programmed operation it found itself at the time of malfunction. It then displays the number of that program stage on read-out 51. The operator is equipped with a list which correlates this displayed number with a stage in the machine. For example, the display of a given number (say 08) may indicate that substrates are not being delivered from first separating station 13 to second separating stations 24. The operator can then easily and quickly intervene and take remedial action.

The motor 45 and other electronic circuitry are, of course, housed within cabinet 11.

Attention is also invited to certain other specific features of the invention.

At the first separator station 20, it is important that the degree to which the wafer extends over track 12 for breaking be not determined by abutting this wafer 15 against a mechanical limiting member. If such a member were used, there would be a tendency for the free end of the wafer to "hang up" against that member, and break in some way other than with the desired clean break along scoring line 16. This is averted, in accordance with the invention, by utilizing photoelectric edge sensing means 22 to determine the positioning of the wafer 15.

At the second separator station 24, a mechanical limiting member is used, namely stop member 25. However, this member is sloped downwardly away from the substrate 18, so that a downward deflection during breaking relieves any possible clamping effect.

Attention is also invited to the fact that there are in the prior art techniques for separating prescored sheets of material into individual elements, by first breaking off columns of these elements, and then breaking each column into individual pieces. However, to applicant's knowledge, this has been done only in relation to large glass plates, which it was desired to subdivide into individual window panes. Illustrative of this are U.S. Pat. Nos. 3,279,664 and 3,286,893. Huge, flat-bed machines, with elaborate right-angled conveyors were apparently used in that connection, with none of the specific features which characterize the present invention. Such prior art machines would be totally inapplicable to substrates such as processed by the present invention, which may have dimensions of 30 by 60 mils in area and a thickness of perhaps 20 mils. Indeed, the advantages of the present invention become more and more pronounced as these substrates become smaller, and therefore more difficult to process by any known prior art techniques.

It will also be understood that various specific embodiments and variations of the invention may be provided.

For example, the electronic circuitry forming part of the machine may take various specific forms in accordance with known principles of logic design.

In fact, it is even possible to essentially omit these electronic means and to perform essentially all the required functions manually.

Thus, the movement of the wafer 15 into first separator station 20 can be performed by manually moving tongue 19 appropriately, and visually determining the extent of protrusion of the wafer 15 over track 12.

The operation of the separator stations can be performed manually by equipping the various moving parts with suitable actuating handles.

The operation of plunger 39 can likewise be performed manually.

The angle of inclination of track 12 can also be adjusted. The preferred angle has been found to be approximately 45°, but other angles may be used, provided they continue to create enough gravity feed force and adequate adhesion of substrates to the track 12.

Other automatic control functions may also be provided. For example, photoelectric sensing means may be positioned at the bottom of magazine 35 to sense when the follower 37 arrives at the bottom due to the magazine having been filled up with substrates 18. This is then used to stop the machine until the operator can empty or replace the magazine.

As previously explained, the use of means which determines the extent of cantilevered protrusion of the wafer 15 in first separator station 20 should not mechanically bind the edge of the wafer. However, photoelectric means is not the only way to accomplish this. Spring finger sensing means, e.g. a microswitch actuator, can also be used. Likewise, other functions in the machine requiring the sensing of the arrival of a substrate can be performed by such other sensing means.

Still other variations will occur to those skilled in the art without departing from the inventive concept.

I claim:

1. A machine for subdividing into individual substrates for use in electronic components a wafer which is prescored with a pattern of intersecting score lines defining the substrates, said machine comprising:
   first means for advancing the wafer progressively over a first support means;
   first means for halting said advance when the wafer extends by substantially the distance between one set of said score lines beyond a predetermined linear region of the support means paralleling these score lines;
   the first support means being so constructed at and beyond said linear region as to impart a localized breaking effect to the wafer along the linear region in response to force applied to the wafer portion extending beyond the region;
   first means for applying said force thereby to break off said wafer portion;
   second support means sloped to allow advancement of the broken-off wafer portion beyond a predetermined linear region of the second support means paralleling the other set of score lines;
   second means for halting said last-named advance when the portion extends beyond the last-named linear region by substantially the distance between the second set of score lines;
   the second support means being so constructed at and beyond its said linear region as to impart a localized breaking effect to the wafer portion along the said last-named linear region in response to force applied to the wafer portion extending beyond said last-named linear region; and
   second means for applying said last-named force thereby to break off the last-named extending portion.

2. The machine of claim 1 wherein
the first support means includes an inclined bed plate adapted to have the wafer positioned thereon.

3. The machine of claim 2 wherein
the second support means includes an inclined track positioned to receive any wafer portion broken-off by the first breaking means and to slidingly deliver same to the second halting means.

4. The machine of claim 3 wherein
the second halting means includes a mechanical stop member extending into the path of the sliding broken-off portion.

5. The machine of claim 4 wherein
each of the first and second breaking means includes reciprocable means for deflecting the extending portion or wafer, respectively, so as to break it off at the score line aligned with the respective first- and second-mentioned linear region.

6. The machine of claim 5 further comprising
an inclined track for slidingly transporting away broken-off substrates from the second breaking means.

7. The machine of claim 6 further comprising
storage means for receiving substrates sliding along the track away from the second breaking means.

8. The machine of claim 7 wherein
the storage means is a C-shaped channel of substrate-shaped interior cross-section, and adapted to mate with a substrate-transmissive aperture in the bottom of the track.

9. A method of subdividing into individual substrates a wafer which is prescored with a pattern of intersecting score lines defining the substrates, said method comprising the steps of:
- advancing the wafer progressively over a first support means paralleling one set of score lines;
- halting the advance when the wafer extends by substantially the distance between one set of said score lines beyond a predetermined linear region of the support means paralleling these score lines;
- breaking off the extending portion of the wafer;
- advancing the broken-off portion beyond a predetermined linear region of a second support means substantially paralleling the other set of score lines;
- halting the last-named advance when the portion extends beyond the last-named linear region by substantially the distance between the last-named score lines; and
- breaking off the substrate extending beyond the last-named linear region.

* * * * *